United States Patent
Baker et al.

(10) Patent No.: US 8,850,293 B2
(45) Date of Patent: Sep. 30, 2014

(54) WIRELESS TRANSMISSION RELIABILITY

(75) Inventors: Steven D. Baker, Beaverton, OR (US); Eric G. Petersen, Beaverton, OR (US)

(73) Assignee: Welch Allyn, Inc., Skaneateles Falls, NY (US)

( * ) Notice: Subject to any disclaimer, the term of this patent is extended or adjusted under 35 U.S.C. 154(b) by 143 days.

(21) Appl. No.: 13/312,742

(22) Filed: Dec. 6, 2011

(65) Prior Publication Data

US 2013/0145236 A1    Jun. 6, 2013

(51) Int. Cl.
| | | |
|---|---|---|
| *H03M 13/05* | (2006.01) | |
| *H04L 1/00* | (2006.01) | |
| *H03M 13/11* | (2006.01) | |
| *H03M 13/53* | (2006.01) | |
| *H03M 13/09* | (2006.01) | |

(52) U.S. Cl.
CPC ............. *H04L 1/0057* (2013.01); *H03M 13/09* (2013.01); *H03M 13/116* (2013.01)
USPC .......................................... 714/776; 714/704

(58) Field of Classification Search
CPC ....... H04L 1/0057; H04L 1/0045; H04L 1/20; H03M 13/09; H03M 13/116; G11B 20/18; G06F 11/10
See application file for complete search history.

(56) References Cited

U.S. PATENT DOCUMENTS

| | | | |
|---|---|---|---|
| 5,740,186 A * | 4/1998 | Widmer ........................ | 714/753 |
| 6,332,139 B1 * | 12/2001 | Kaneko et al. ........................ | 1/1 |
| 6,714,551 B1 | 3/2004 | Le-Ngoc | |
| 7,394,780 B1 | 7/2008 | Gregory | |
| 7,924,761 B1 | 4/2011 | Stevens | |
| 2002/0197989 A1 * | 12/2002 | Cruder et al. ................. | 455/426 |
| 2004/0042387 A1 | 3/2004 | Geile | |
| 2004/0090310 A1 | 5/2004 | Hohberger et al. | |
| 2004/0160943 A1 | 8/2004 | Cain | |
| 2006/0072623 A1 * | 4/2006 | Park .............................. | 370/487 |
| 2006/0075321 A1 | 4/2006 | Vedantham et al. | |
| 2006/0116073 A1 * | 6/2006 | Richenstein et al. ........ | 455/3.06 |
| 2006/0184860 A1 * | 8/2006 | Takagi .......................... | 714/774 |
| 2006/0224048 A1 | 10/2006 | Devaul et al. | |
| 2006/0280205 A1 * | 12/2006 | Cho .............................. | 370/473 |
| 2007/0015973 A1 | 1/2007 | Nanikashvili | |
| 2008/0084821 A1 * | 4/2008 | Maze et al. ................... | 370/232 |
| 2008/0287748 A1 | 11/2008 | Sapounas et al. | |
| 2009/0003207 A1 * | 1/2009 | Elliott ........................ | 370/230.1 |

(Continued)

FOREIGN PATENT DOCUMENTS

WO     2010/100443 A1     9/2010

OTHER PUBLICATIONS

International Search Report and Written Opinion in PCT/US2012/060417, mailed Mar. 29, 2013, 9 pages.

(Continued)

*Primary Examiner* — Guerrier Merant
*Assistant Examiner* — Dipakkumar Gandhi
(74) *Attorney, Agent, or Firm* — Merchant & Gould P.C.

(57) ABSTRACT

A method for performing error correction during a transmission of physiological data includes two or more data packets that are sent from a first electronic computing device to a second electronic computing device. Each of the data packets includes physiological data. Each of the data packets has a first packet size. Each of the data packets includes error correction information. The error correction information for each of the two or more packets is distributed across the two or more data packets.

12 Claims, 8 Drawing Sheets

(56) References Cited

U.S. PATENT DOCUMENTS

| | | |
|---|---|---|
| 2009/0069642 A1 | 3/2009 | Gao et al. |
| 2009/0193314 A1 | 7/2009 | Melliar-Smith et al. |
| 2009/0307766 A1 | 12/2009 | Rose et al. |
| 2010/0153822 A1* | 6/2010 | Huang et al. .................. 714/776 |
| 2010/0293429 A1* | 11/2010 | Hamman et al. .............. 714/752 |
| 2011/0093758 A1 | 4/2011 | Etkin |
| 2012/0151298 A1* | 6/2012 | Nicholes ....................... 714/763 |

OTHER PUBLICATIONS

Baldus et al.; "Reliable Set-Up of Medical Body-Sensor Networks" copyright 2004 Springer-Verlag, 11 pages.

Hao et al.; "Wireless body sensor networks for health-monitoring applications" copyright 2008 Institute of Physics and Engineering in Medicine, 31 pages.

Otto et al.; System Architecture of a Wireless Body Sensor Network for Ubiquitous Health Monitoring copyright 2006 Rinton Press, pp. 307-326.

Puers et al.; "Short Distance Wireless Communications" copyright 2011 Springer Science+Business Media, LLC, 50 pages.

Shah et al.; "On the performance of Bluetooth and IEEE 802.15.4 radios in a body area network" Copyright 2004 ACM, 9 pages.

Taparugssanagorn et al.; "Network coding for non-invasive wireless body area networks" copyright 2010 IEEE, 5 pages.

* cited by examiner

WIRELESS TRANSMISSION RELIABILITY

BACKGROUND

Networks used for transmitting medical data have a high requirement for data reliability. In a clinical setting, body area networks and other personal area networks often include wireless devices that may be physically attached to a patient. Wireless devices typically have higher transmission error rates than devices that are connected via wires or cables.

Patient medical data from a body area network is commonly transmitted to an electronic medical records (EMR)/electronic health records (EHR) system where the medical data can be stored and analyzed. The EMR system can be located on a different network than the body area network. The medical data may also need to be routed through one or more access points on additional networks before reaching the EMR system.

When transmitting data packets across networks, it is common to implement an error correction scheme in which redundant data is transmitted. The error correction scheme permits data to be reconstructed if some packets are lost during transmission. However, the redundant data is typically removed at intermediate nodes when the data is transmitted between networks. For the transmission of medical data across multiple networks, the loss of redundant data may make data reconstruction at endpoints difficult, especially when packet loss is high.

SUMMARY

Aspects of the disclosure are directed to a method for performing error correction during a transmission of physiological data. Two or more data packets are sent from a first electronic computing device to a second electronic computing device. Each of the data packets includes physiological data. Each of the data packets has a first packet size. Each of the data packets includes error correction information. The error correction information for each of the two or more packets is distributed across the two or more data packets.

In another aspect, a medical device incorporates a forward error correction scheme. The medical device comprises a processor, a memory and an error correction module with forward error correction. The error correction module is configured to reconstruct data packets lost during the transmission of physiological data. The reconstruction comprises the inclusion of redundant data content across multiple data packets.

In another aspect, a first electronic computing device comprises a processing unit and a memory connected to the processing unit. The system memory comprising instructions that, when executed by the processing unit, cause the processing unit to send two or more data packets from the first electronic computing device to a second electronic computing device. Each of the data packets includes physiological data. Each of the data packets has a first packet size. Each of the data packets includes error correction information. The error correction information for each of the two or more data packets is distributed across the two or more data packets. The error correction information incorporates a method of forward error correction. The error correction information provides redundant packet data in a data portion of each of the data packets. A transmission error rate is determined for the one or more data packets. The transmission error rate is determined from packet error information received from the second electronic computing device. A determination is made as to whether the transmission error rate is greater than a first predetermined threshold. When the packet error rate is greater than the first predetermined threshold, the first packet size is decreased to a second packet size. A determination is made as to whether the transmission error rate is not greater than a second predetermined threshold. The second predetermined threshold is smaller than the first predetermined threshold. When the transmission error rate is not greater than the second predetermined threshold, forward error correction is disabled at the first electronic computing device. A determination is made as to whether the transmission error rate is greater than a third predetermined threshold. The third predetermined threshold is smaller than the first predetermined threshold but larger than the second predetermined threshold. When the transmission error rate is greater than the third predetermined threshold, error correction is enabled at the first electronic computing device. A determination is made as to whether the transmission error rate is less than a fourth predetermined threshold. The fourth predetermined threshold is smaller than the first predetermined threshold. When the transmission error rate is less than the fourth predetermined threshold, the first packet size is increased to a third packet size. One or more additional data packets are sent from the first electronic computing device to the second electronic computing device. Each of the one or more additional data packets have either the first packet size, the second packet size or the third packet size. Information is received that data reconstruction errors at the second electronic computing device are greater than a fourth predetermined threshold. When it is determined that the data reconstruction errors at the second electronic computing device are greater than the fourth predetermined threshold, a limit is imposed on a type of data to be transmitted at the first electronic computing device. Management level communication is sent in the one or more data packets. The management level communication includes information on one or more of battery power, signal strength, packet size and whether to disable of enable data error correction.

The details of one or more techniques are set forth in the accompanying drawings and the description below. Other features, objects, and advantages of these techniques will be apparent from the description, drawings, and claims.

DETAILED DESCRIPTION

The present disclosure is directed to example systems and methods for providing an error correction scheme for transmission of physiological data from sensor devices in a body area network (BAN). The example error correction scheme provides for including error correction data in an application layer for data packets transmitted between endpoints in the BAN and also to endpoints on other networks.

The error correction data includes redundant copies of the physiological data being transmitted. Applying the error correction scheme to data in an application layer or any layer above a data link layer, e.g., network, transport, session, presentation, or application layer, in the OSI model allows the error correction data to be preserved when the physiological data is transmitted across access points on multiple networks. This is sometimes referred to herein as forward error correction. Maintaining the error correction data across access points and gateways permits reconstruction of the physiological data at an endpoint when packet loss occurs during the transmission of the physiological data.

The example systems and methods also provide for monitoring a transmission error rate during the transmission of the physiological data. As defined in this disclosure, a transmission error rate may be any metric that measures the robustness of a communication channel, such as bit error rate, packet error rate, and packet loss rate. Depending on the transmission error rate, a packet size may be adjusted. In addition, based on the transmission error rate, the error correction scheme may be enabled or disabled. As explained later herein, adjusting the packet size may improve efficiency in data transmission and may reduce the transmission error rate. The error correction scheme may be disabled when the transmission error rate is low. Disabling the error correction may increase battery life for wireless medical sensor devices.

With forward error correction, a finite number of bit errors can be recovered so that even when a packet is received with bit errors, the packet can be recovered. Packet error rate is the number of incorrectly received packets divided by the total number of received packets, and is typically considered after forward error correction is used to reconstruct the packet. When forward error correction can successfully reconstruct a packet, as verified by a cyclic redundancy code (CRC) check, there is no packet error. When the CRC check fails, there is a packet error.

A packet loss rate is an indication of a number of packets that are lost during the transmission that could not be recovered. If a packet error occurs and if packet data can be recovered, for example, via either forward or backward error correction, the packet error does not result in a packet loss. Transmitting packet error and packet loss information is termed management level communication and may also comprise other status and configuration data such as setting transmit power levels, configuring data transmission rates, changing the encoding rate, reporting battery voltage, reporting error messages and the like.

Figure 1:
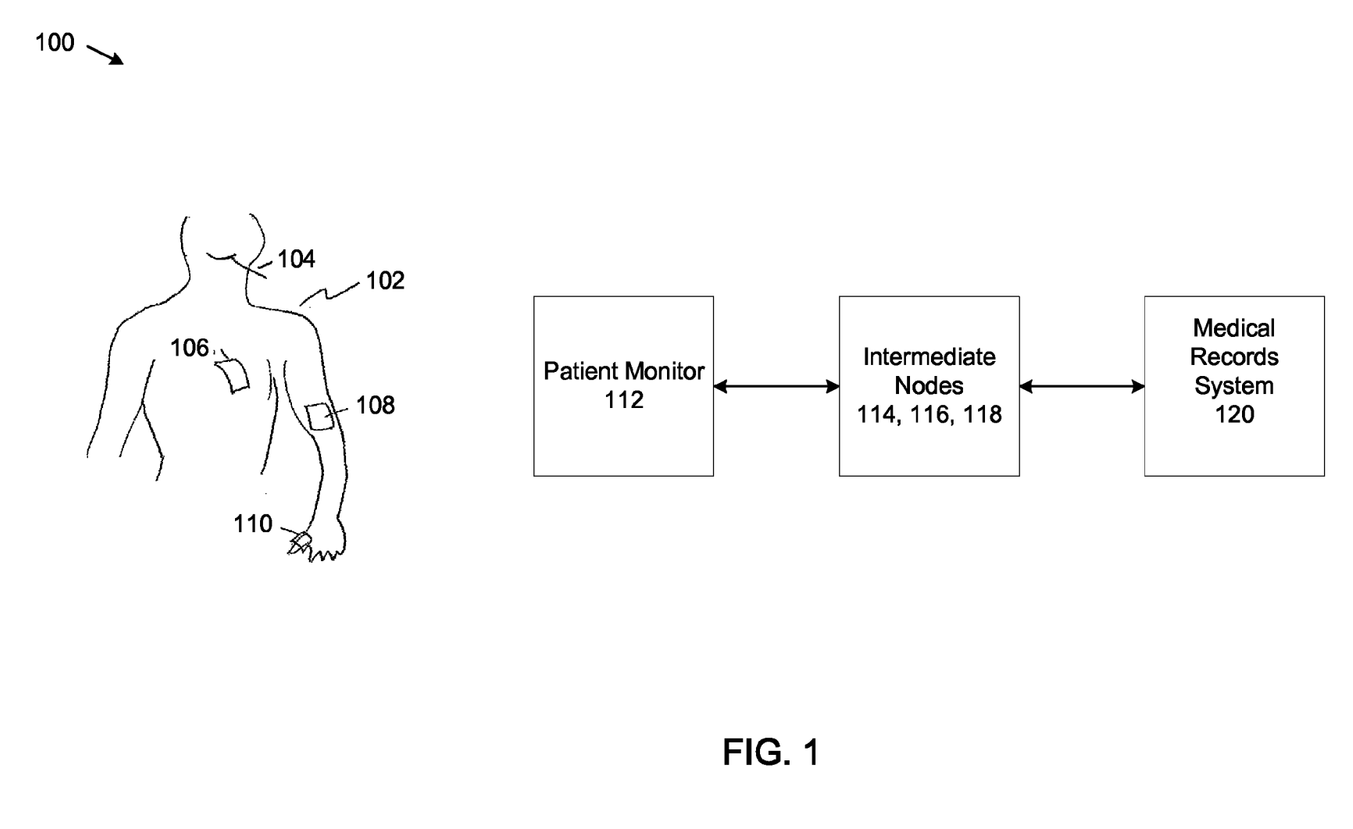
FIG. 1 shows an example system for transmitting physiological data from a body area network.

FIG. 1 shows an example system 100 for transmitting physiological data from a BAN to an EMR system. In this disclosure, a reference to EMR refers to either EMR or EHR. Other systems, for example Acuity® Central Monitoring Station manufactured by Welch Allyn, Inc., Skaneateles Falls, N.Y., that communicates with an EMR may also be the electronic medical records system. FIG. 1 includes a patient 102, a patient monitor 112, intermediate nodes 114, 116, 118 and an EMR system 120. In FIG. 1, the BAN is a personal area network in which one or more physiological sensor devices are placed on the body of the patient 102. In the system 100, the physiological sensor devices placed on the body of the patient include a thermometer 104, an ECG sensor 106, a blood pressure cuff 108 and an SPO2 sensor 110. A plurality of the physiological sensor devices are wireless sensor devices. More, fewer and different physiological sensor devices may be used.

The patient monitor 112 is an electronic computing device that receives data from the physiological sensor devices, displays at least part of the data, and transmits the data to the EMR system 120. The patient monitor 112 typically is not connected on the same network as the EMR system 120. Typically, the patient monitor 112 has access to an intermediate node such as a gateway device or access point. A gateway device allows devices on two different networks to communicate.

The networks may be two different networks of the same type, e.g. two different Ethernet networks such as a 192.168.30.0/24 class C network and a 172.29.0.0/16 class B network. The networks may be of two different types, such as an Ethernet network and a Body Area Network, such as a Bluetooth or Zigbee network or 802.11 wireless Ethernet and 802.3 wired Ethernet. The gateway device may also function as a router or layer-3 switch and allow devices on different networks and/or different types to communicate, for example, physiological data from the patient monitor 112 to the EMR system 120.

In some embodiments, more than one intermediate node may be used. In the example system 100, patient monitor 112 may be considered as an intermediate mode. The example system 100 includes four intermediate nodes 112, 114, 116 and 118. Each intermediate node 112, 114, 116, 118 is an electronic computing device, typically a router, bridge or layer-3 switch. The intermediate nodes 112, 114, 116 and 118 may also function as gateways between networks on which the intermediate nodes 112, 114, 116 and 118 reside. More or fewer intermediate nodes may be used. In addition, multiple pathways between endpoints can be used, so that different packets journey across different paths between the endpoints. Some sensors may be embedded in patient monitor 112.

Figure 2:
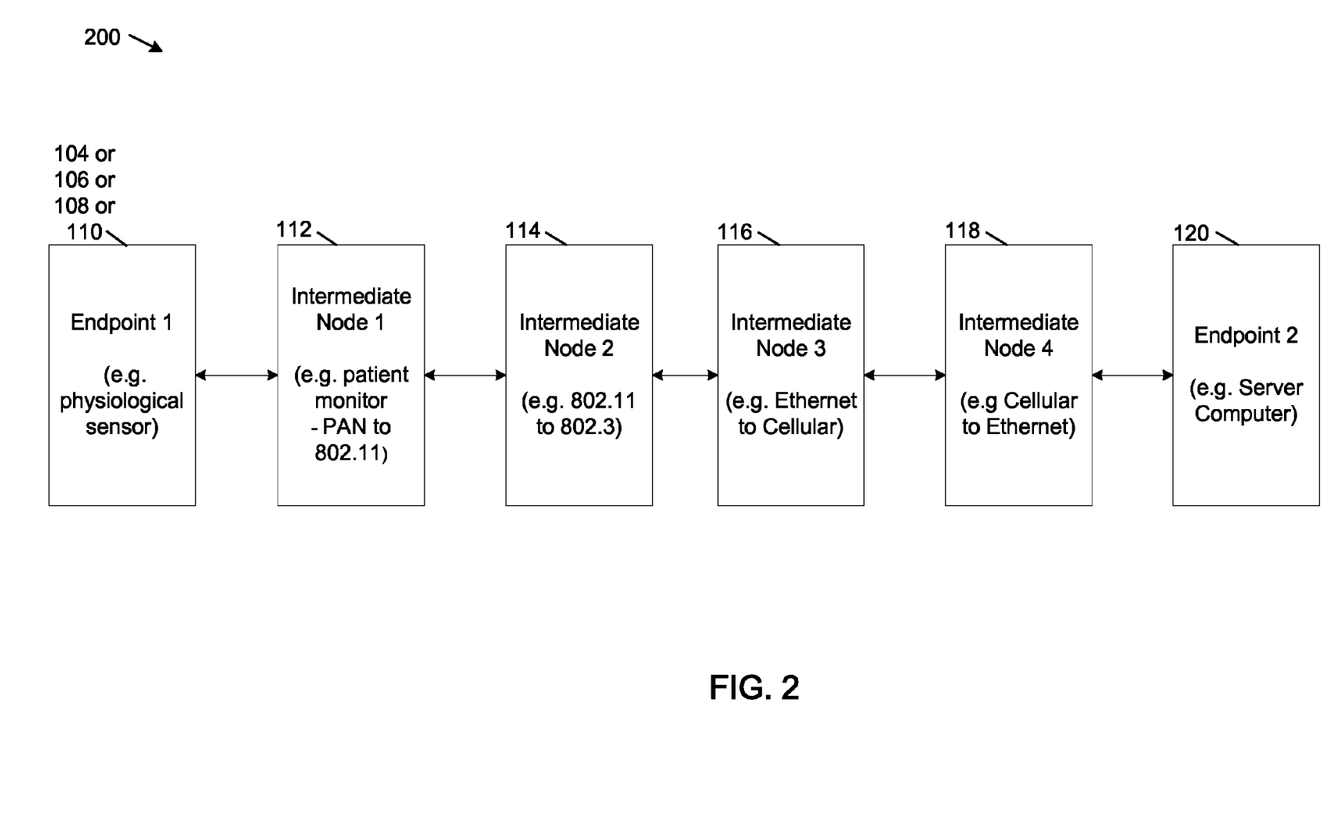
FIG. 2 shows example network nodes in the example system of FIG. 1.

FIG. 2 shows six nodes in the example system 100. The example system 100 includes two endpoint nodes and the four intermediate nodes 112, 114, 116 and 118. One endpoint node (endpoint node 1) is a physiological sensor, for example physiological sensors 104, 106, 108 or 110. In examples, a second endpoint node (endpoint node 2) is the EMR system 120. The intermediate nodes 112, 114, 116 and 118 relay the physiological data from endpoint 1 (physiological sensors 104, 106, 108, and 110) to endpoint 2 (EMR system 120).

In examples, intermediate node 112 is a patient monitor (patient monitor 112) that acts as a bridge between a personal area network (PAN) such as Bluetooth, Ultra-wideband, ZigBee or ANT and a wireless local area network (WLAN) such as 802.11 a/b/g/n or a wired LAN such as 802.3 Ethernet. In examples, intermediate node 114 is an electronic computing device on a wi-fi network that acts as a bridge between the WLAN and a distribution system such as Ethernet (802.3), intermediate node 116 is an electronic computing device on a wired Ethernet network that bridges to a cellular network and intermediate node 118 is an electronic computing device on a wide area network (WAN), for example a cellular network that bridges to an Ethernet network where endpoint 2 (EMR system 120) resides.

Intermediate nodes 112, 114, 116 and 118 may implement different technologies and additional intermediate nodes may be used. As explained later herein, the intermediate nodes 112, 114, 116 and 118 implement different technologies and may implement different packet sizes when transmitting the physiological data.

When the example error correction scheme of the present disclosure is enabled, physiological data transmitted from endpoint 1 (physiological sensors 104, 106, 108, 110) to endpoint 2 (EMR system 120) includes error correction data along with the physiological data. The error correction data represents redundant data that can be used to reconstruct the physiological data at endpoint 2 when packet data is lost during transmission.

An example error correction scheme commonly used in data transmission is forward error correction (FEC), such as the Reed-Solomon encoding used in 802.11a/g/n. In FEC, systematically generated redundant data is added to messages before being transmitted. The redundant data allows the receiver to recover from a limited number of errors and the recovery is limited to a single packet. That is, the single packet contains FEC information for itself only.

One example that allows recovery from a single bit error in the transmission is as follows: if a binary 1 is encoded as 111, and the receiver receives the encoded symbol with either zero or one bit errors, e.g., 111, 110, 101, or 011, the receiver can determine that the original bit value was a 1. This system allows for error correction with a 33% bit error rate, but at a cost of tripling the transmitted bits. This is a one-third encoding rate where for every 1 bit input to the FEC encoder, there are 3 bits in the output, encoded symbol.

More efficient solutions apply FEC across symbols that represent larger groups of data. Some FEC systems look at the entire message for context. A cyclic redundancy code (CRC) check is typically employed after the FEC decoding. The CRC is part of the encoded data. If the CRC check fails, the packet is discarded. Discarded packets may be retransmitted as part of a communication protocol, e.g. 802.11. This retransmission is a form of backwards error correction.

In communication where the probability of packet errors is very low, FEC may be omitted and only reverse error correction is used. For data transmissions over a network, for example using a communication protocol for wireless networks such as IEEE 802.11 with a cellular backhaul, the FEC encoding is generated for each data transmission between nodes, and the data are decoded at each receiver.

In the example of FIG. 2, data transmitted from endpoint 1, e.g. from physiological sensor 110, has forward error correction applied to the original data before the data are provided to the link layer, which typically resides in the radio. In examples, the FEC may be applied at the application layer. The original data with forward error correction applied is transmitted to patient monitor 112 where the data is put in an IP packet with a wrapper consisting of a header and CRC. The packet is then passed to the MAC layer where it is put in an 802.11a/g/n packet, complete with 802.11 header, CRC and FEC. The 802.11 transmission from patient monitor 112 is received by the 802.11 receiver in node 114 where the data are recovered using the 802.11 FEC, then verified using the 802.11 CRC check.

When the 802.11 packet is decoded, the 802.11 FEC is discarded. The data with FEC that existed at transmission from endpoint 1 are still inside the IP wrapper and are transmitted out the other side of intermediate node 114, in this example, using 802.3 Ethernet that has no protocol-based FEC. Upon reception by intermediate node 116, the Ethernet CRC check is made. Assuming the cellular WAN implements IP, then the process between intermediate nodes 116 and 118 and also between intermediate node 118 and endpoint 2 (EMR system 120) is analogous to that between nodes intermediate nodes 114 and 116. The cellular network, being wireless, may implement FEC as does 802.11. Assuming the WAN, e.g. cellular, does not implement FEC, then if a packet is lost between intermediate nodes 116 and 118, the remaining packets are transmitted to endpoint 2.

Endpoint 2 uses the FEC information that endpoint 1 created and encoded across multiple packets to recover the data that was contained in the lost packet. As indicated in this example, for some transmissions, FEC is not part of the protocol, so protocol-based FEC is not re-generated.

Also illustrated is that FEC may be added at different points. For example, FEC may be added to the data, then the encoded data are handed to the IP layer that builds the packet, including the IP header and CRC, and subsequently the MAC layer (part of the data link layer) adds the MAC header, CRC and the FEC called out by 802.11.

Alternately, the packet may be built with un-encoded data and then FEC applied to the entire packet, including the header & CRC at the MAC layer. The latter is the solution used for 802.11. When the packet is received, the FEC decoder, e.g., a Reed-Solomon Decoder, attempts to reconstruct the packet using the received data and CRC. A CRC check confirms if the data are reconstructed correctly. If data are reconstructed correctly, the system sends an acknowledgement (ACK) to the transmitter.

If the data are not reconstructed correctly (indicated by a CRC check failure), no ACK is sent and the transmitter automatically retransmits the data. A first alternative may be implemented when the packets are small and the FEC information is distributed across multiple packets. For this alternative, if a packet has a CRC failure, it may simply be thrown out and the FEC that exists in the remaining packets is used to determine the content of the missing packet.

In yet another alternative, the FEC may be added to the data, then the encoded data are handed to another layer that builds a packet, including a header and CRC, then implements a second FEC around the entire packet. The packet is received and the second FEC is used to recover from errors and the CRC is confirmed. When the FEC code is added to the application layer at an initial endpoint (for example at physiological sensor 110), the FEC code in the application layer is not stripped out between intermediate nodes and is available for reconstructing the physiological data at endpoint 2 (EMR system 120).

In examples, compressive sampling may be used to distribute FEC information across multiple packets. With compressive sampling, FEC information is created for each of the multiple data packets such that redundant error correction information for each data packet is included in each of the multiple packets. By including redundant error correction information for each data packet in each of the multiple data packets, if one or more packets of the multiple data packet are lost, there may be sufficient error correction information in other packets of the multiple data packets to reconstruct the one or more lost data packets.

For ECG and some other physiological signals, representing the signals in a Gabor basis results followed by a pre-coding to randomize the samples results in a sparse representation in the time domain. After transforming to the Gabor basis, many or most of the samples are very small and have trivial information content The signal can be reconstructed with very little error even if these samples are missing (although that error may still be clinically significant).

Pre-coding the data by randomizing the samples in the Gabor basis mixes the trivial samples with the important samples in a known way. The known way is required for the receiver to re-order the samples. When these data are transmitted, and a packet is lost, much of the loss is actually the trivial data. In the case of data reception without packet loss, the data reconstruction is accomplished by a simple matrix inversion.

Unlike traditional FEC that is bit oriented, this approach uses a sample-oriented implementation of FEC and has a soft-failure mode with an ability to estimate the data with a high probability of a small reconstruction error. This means that the reconstructed data is likely to match the original data even with high packet loss rates where many samples are missing.

Compressive sampling may be used to decrease the number of samples to be transmitted. Alternately, the system may transmit all the samples and if some samples are lost during transmission, this is essentially equivalent to transmitting fewer samples. Based on the transmission error rate, the system may dynamically scale the number of samples transmitted.

In one embodiment, FEC is applied to waveform data derived from one or more the physiological sensors 104, 106, 108 and 110. However, FEC may not be applied to other data including numerical data or annotations. Some example considerations and reasons for this are: the rate of the numerical data is not conducive to a specific type of FEC, the data rate is so low that the cost or retransmission is negligible, and/or the waveform data are transmitted separately from the numerical data.

Figure 3:
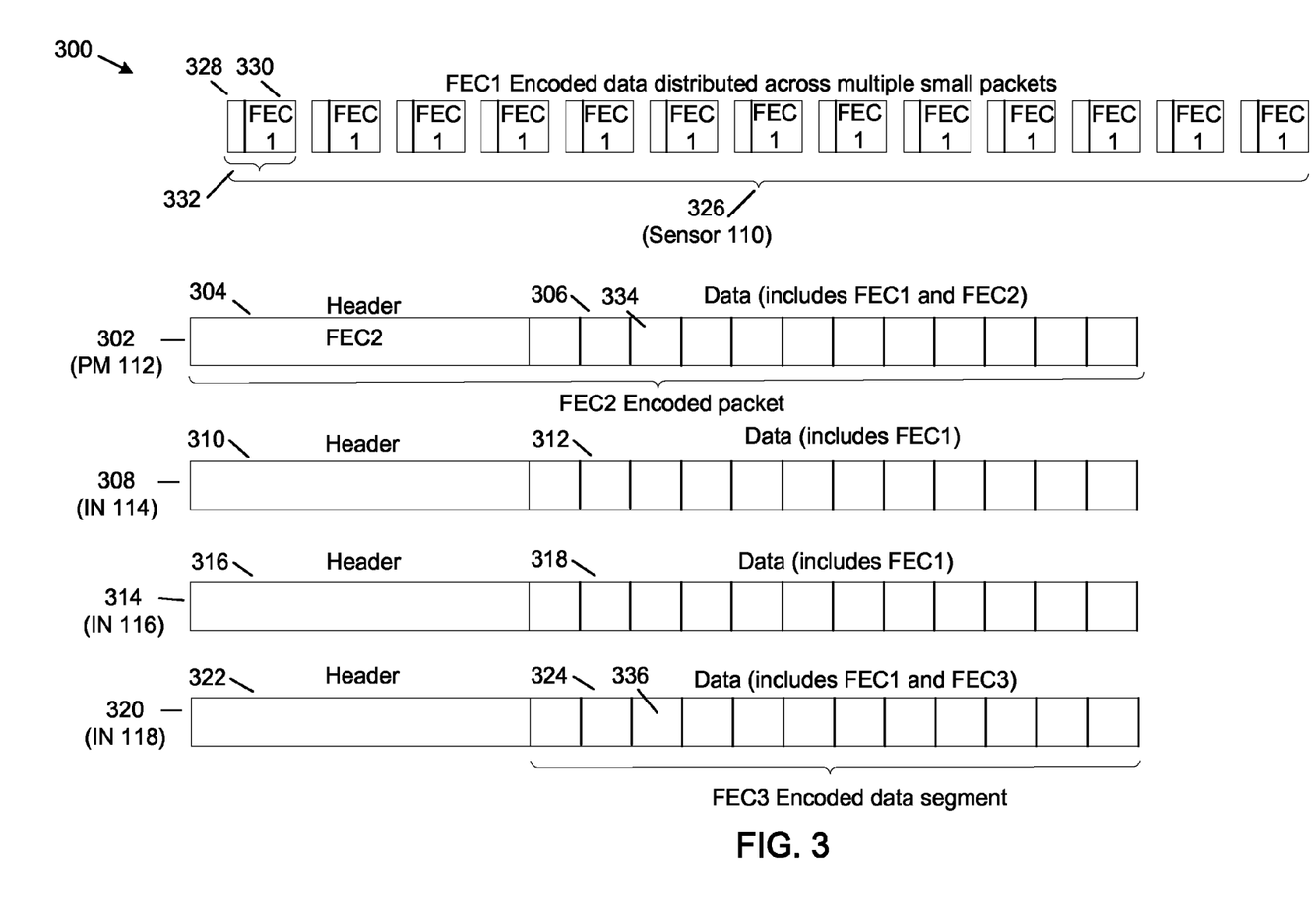
FIG. 3 shows example messages transmitted between the network nodes of the example system of FIG. 1.

FIG. 3 shows example messages transmitted between endpoints 1 and 2 via intermediate nodes 112, 114, 116 and 118. Endpoint 1 corresponds to a physiological sensor, for example, physiological sensors 104, 106, 108 or 110. Endpoint 2 corresponds to the EMR system 120. Each message constitutes a data packet that includes a header section and a data section. In examples, intermediate node 112 may be a patient monitor (patient monitor 112).

In examples, patient monitor 112 may transmit using the 802.11 protocols where the FEC is applied to the entire packet, irrespective of any error correction that exists for the data. In addition, at endpoint 1, an initial FEC code is added to the message by an application layer. From the perspective of the physical and MAC layers, the FEC is part of the data section of the message and is intermingled with the data.

As shown in FIG. 3, message 326 originating from physiological sensor 110 (endpoint 1) includes multiple small packets 332. Each small packet 332 includes a header section 328 and a data section 330. Before the data are provided to the link layer, an FEC encoding (FEC1) is generated for the physiological data being sent from a physiological sensor, for example from physiological sensor 110 to the EMR system 120 (endpoint 2).

The FEC1 encoding includes redundant data that permits the physiological data from physiological sensor 110 to be reconstructed at EMR system 120 or any other point in the transmission, even when a number of packets are lost during transmission of the physiological data. This is possible when the FEC1 data are distributed across multiple packets. The FEC1 encoding may be left intact through each node relaying the message. Additional error correction may be applied to any part of or the entire packet at each node, including error correction by the wireless protocol used by physiological sensor 110.

In examples, message 326 is shown with only one layer of FEC, namely FEC 1. Alternately, some or all nodes may apply no additional error correction, as may be the case for wired Ethernet where the transmission reliability is high (in this example, messages 308 and 314). Message 302 may for example be from patient monitor 112 with an 802.11 uplink. Since 802.11 adds FEC to the entire packet, including both the 802.11 header and the data section, message 302 is shown with additional FEC encoding 334 (FEC2) across the entire packet including the header and data sections. The data section is larger due to the additional FEC encoding, which adds redundant data across the entire message 302. The data section includes the additional the original FEC1 encoding applied by physiological sensor 110 and also the FEC2 encoding that the 802.11 protocol applies to the entire message.

If, for example, no FEC is used in the transmission protocol in successive transmission steps from intermediate nodes 114 and 116, then messages 308 and 314, respectively would not have full-packet FEC, but maintain the FEC1 from physiological sensor 110. If, for example, the transmission protocol used between intermediate node 118 and endpoint 2 (EMR system 120) applies FEC to only the data, then the data section of message 320 has FEC applied twice: FEC1 and FEC3. FEC1 is the encoding that was applied to each of the small data sections by physiological sensor 110 and FEC3 is the FEC encoding applied by intermediate node 118 that covers the data section of message 320, analogous to small packets 330.

Because endpoints 1 and 2 (physiological sensor 110 and EMR system 120, respectively) are located on different networks, message 326 is directly transmitted to patient monitor 112. Message 326 may be transmitted as individual small packets 332, as groups of small packets 332, or with all these small packets 332 grouped together in a superpacket. As small packets, the probability of transmission error in any one packet is smaller than for a superpacket and if one packet is lost, the FEC1 distributed across the remaining packets may be used to re-construct the missing data.

Transmitting as a superpacket often has transmission efficiencies as there is less overhead waiting for each packet to be acknowledged. For this example, it is assumed message 326 is transmitted as multiple small packets 332 and an FEC is applied across the group of packets such that if one is lost, the others can be used to re-construct the full message 326. The FEC for the message 326 is encoded across the multiple data sections 330. Subsequent to this, the radio builds packets 332, adding a header that includes typically at least CRC, source address, and a destination addresses.

When the packets are built, a per-packet FEC may be added, depending on the protocol. In this example, there isn't a per-packet FEC, only the FEC1 distributed across the data in the multiple packets 332. When received at patient monitor 112, a CRC check is made. If any packet 332 has a CRC check failure, the remaining packets 332 may be used to reconstruct the message, but typically, only end nodes will have the application to re-construct the data.

Alternately, a packet with a failed CRC may be re-transmitted. For this example, it is assumed that one of small packets 332 fails the CRC check and is discarded by patient monitor 112, that there is no re-transmission, and that re-construction of the data only occurs at endpoint 2 (EMR system 120). A new message 302 is then created to send physiological data from patient monitor 112 to intermediate node 114. Patient monitor 112, in communication with the server at endpoint 2 has knowledge of the integrity of the communication channel.

Endpoint 1 (for example physiological sensor 110) may similarly have knowledge of the integrity of the communication channel, either through communication to the server at endpoint 2 or relayed from patient monitor 112. If the communication channel is robust (e.g., the server receives packets with virtually no errors), then patient monitor 112 may choose to concatenate the multiple data portions 330 of message 326 into one superpacket.

If the communication channel is not robust, then patient monitor 112 may choose to send each of the small packets separately, adding a per-packet FEC per the 802.11 protocol. In this case, the transmission from patient monitor 112 is similar to that transmitted by endpoint 1, except that in addition to FEC1 in each data section 330, each of the small packets would have a per-packet FEC that covers the entire packet, including the header and data section.

For 802.11n radios and other MAC layers where block acknowledgement is supported, the additional overhead for transmitting multiple, small packets is decreased substantially, so patient monitor 112, with knowledge of the radio protocol, may choose to deliver multiple data portions 330 in a way that is advantageous for that protocol.

For example if the radio is using 802.11n where block acknowledgement support exists and there is little power and time penalty for transmitting multiple, small packets, patient monitor 112 may burst multiple data portions 330 to the radio so the radio transmits them separately, but using one block ACK.

If the radio is using 802.11 a/g, then the monitor may concatenate multiple data portions 330 and deliver that concatenated result to the radio so the radio transmits message 326 as a single packet. Patient monitor 112 may also choose to aggregate a subset, perhaps three or six of the multiple data portions 330 for an intermediate level of packet size. This latter solution may also be accomplished if patient monitor 112, at the application level, changes the fragmentation threshold or the maximum transmission unit threshold for the radio. In this example, it is assumed there is a robust communication channel and patient monitor 112 concatenates all the remaining, multiple data portions 330 that comprise original message 326.

The 802.11a/g/n radio in patient monitor 112 adds FEC across the entire packet, including the header, so message 302 includes an additional FEC code 334 (FEC 2). The FEC 2 code represents a forward error correction for the message 302, and the original FEC 1 redundant data remains in distributed across each of the data portions 330, now concatenated into a single data section of message 302. The data section 306 of message 302 is not processed by intermediate node 114. Intermediate node 114 transmits the data section 306 intact. Therefore, the data section 312 of message 308 includes the FEC 1 code and maintains the redundant data that was generated at endpoint 1. Since 802.3 Ethernet does not have FEC, there is no FEC at the packet level, but there is a CRC.

When message 308 is received at intermediate node 116, a CRC check is performed on message 308. If the CRC check fails, intermediate node 114 may re-transmit the message 308. In any event, a new message 314 is created at intermediate node 116 for transmitting the physiological data to intermediate node 118. Under the assumption of Ethernet over cellular and no FEC in the cellular protocol, a new CRC is generated by node 116 as part of the header for message 314. The data section 318 of message 314 still includes the FEC 1 encoding and maintains the redundant data that was generated at physiological sensor 110.

Similarly, when message 314 is received at intermediate node 118, a CRC check is performed on message 314. A new message 320 is created at intermediate node 118 for transmitting the physiological data to endpoint 2 (EMR system 120). The data section of message 320 still includes the FEC1 code and maintains the redundant data that was generated at physiological sensor 110.

When message 320 is received at endpoint 2, a CRC check is performed on message 320. The data 324 are handed up to the application layer where the forward error correction (FEC1) distributed across the multiple small packets 332 in the data section of message 320 permits the physiological data to be reconstructed, as explained later herein. Reconstruction is made possible by the FEC1 code which is maintained during the transmission of the physiological data across intermediate nodes 112, 114, 116 and 118.

Messages may be transmitted from endpoint 2 (EMR system 120) to endpoint 1 (physiological sensor 110) using similar processes, however; if endpoint 2 has significantly more processing power than endpoint 1 as is typically the case for wireless sensors, then preferably a different FEC solution is used. That is, ideally, the weakest processor has the smallest computational burden for both packet transmission and reception. An FEC solution that is very light for creating the FEC will typically require more computation for packet reconstruction.

In examples, one or more of intermediate nodes 112, 114, 116 and 118 may not implement FEC but may implement another error correction scheme such as reverse error correction where a failed reconstruction of a message causes the receiver to request the transmitter to re-transmit the data, or may not implement error correction at all. Thus, multiple and overlaid error correction schemes may be used.

Multiple error correction schemes may be used because one or more of the intermediate nodes 114, 116 and 118 may be owned and operated by different entities than entities that may own and operate physiological sensor 110, patient monitor 112 and EMR system 120. However, whether or not error correction schemes other than FEC are used in one or more intermediate nodes 114, 116 and 118, the FEC1-encoded data are passed intact through the intermediate nodes 114, 116 and 118. This is because, regardless of any error correction schemes used by intermediate nodes 114, 116 and 118, the data section of each message, which includes FEC1, is unchanged by intermediate nodes 114, 116 and 118.

Devices that need to analyze and/or display the data and also forward the data, for example patient monitor 112, may forward the data as described above and may in a separate, embedded communication path reconstruct the data using FEC 1. An alternate solution would be for patient monitor 112 to reconstruct the data, and then separate the embedded communication paths, one for analysis/display and one forwarding the data to endpoint 2. This alternate solution either loses the FEC 1 encoding or must re-create it.

Figure 4:
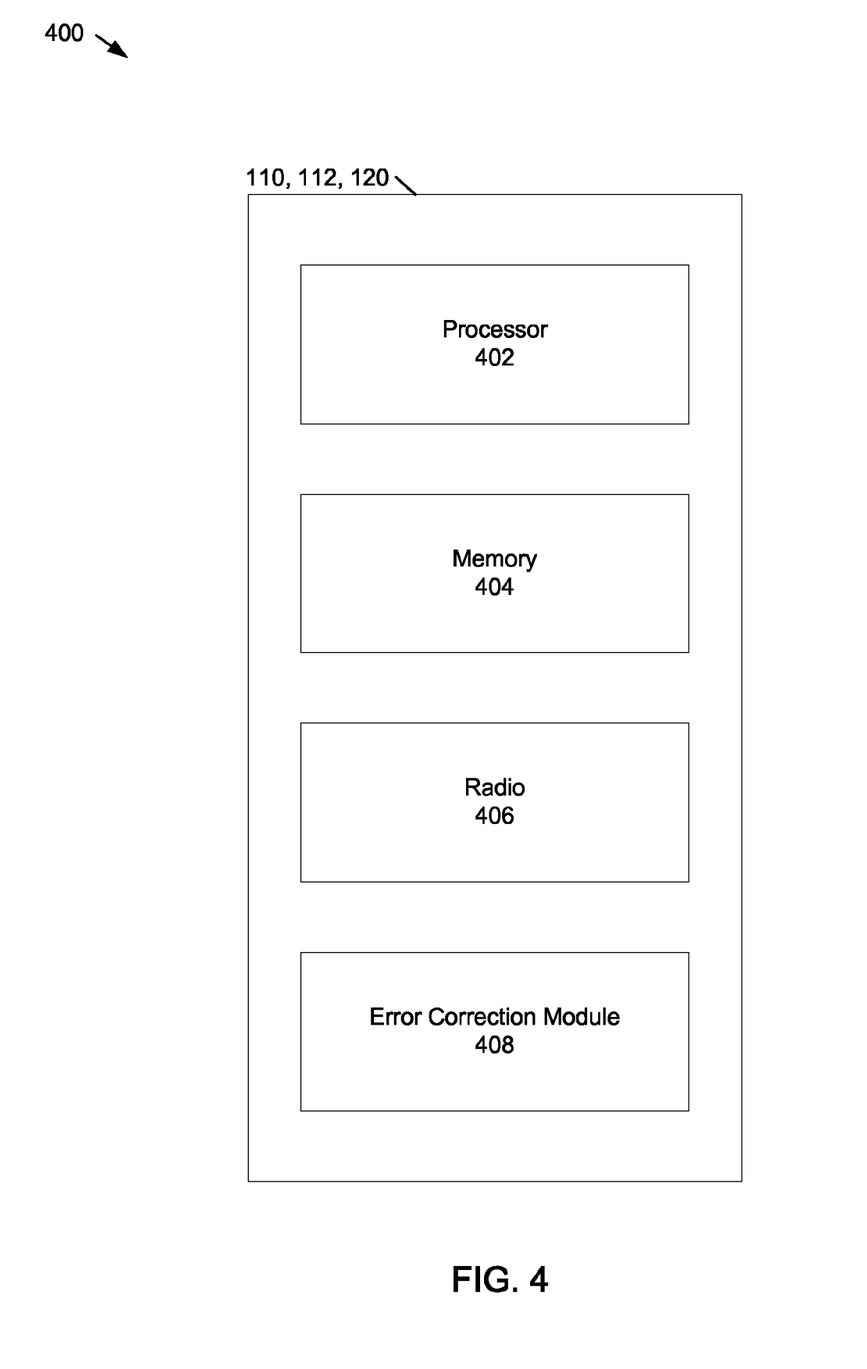
FIG. 4 shows example components of the patient monitor and the EMR system of FIG. 1.

FIG. 4 shows example modules 400 of physiological sensor 110, patient monitor 112 and EMR system 120. As discussed, physiological sensor 110, patient monitor 112 and EMR system 120 are electronic computing devices. The example modules 400 include a processor 402, a memory 404, a radio 406 and an error correction module 408. The processor 402 executes instructions stored in the memory 404 to implement functionality on physiological sensor 110, patient monitor 112 and EMR system 120.

The error correction module 408 implements error correction functionality on physiological sensor 110, patient monitor 112 and EMR system 120. As discussed, patient monitor 112 may use FEC1 to recover missing packet information, and depending on the implementation, may also apply FEC at the application layer analogous to the FEC1 implemented by physiological sensor 110. This may be the case when the monitor has to re-construct data due to a missing packet 332.

After reconstructing the missing data packet 332, the monitor creates a new FEC that is applied across all data 330 in the message. The error correction functionality includes generating an FEC, monitoring packet transmission error rates, adjusting packet size for transmission, determining whether error correction should be disabled or enabled and reconstructing the physiological data from physiological sensor 110 when a certain level of packet loss occurs. Radio 406 may include additional, protocol dependent FEC that operates independent of error correction module 408, for example for an 802.11a/b/g/n radio. In one example, EMR system 120 may include radio 406. In another example, EMR system 120 may not necessarily include radio 406, for example if an Ethernet connection is used instead of a wireless connection. In this example radio 406 is an Ethernet transceiver.

Figure 5:
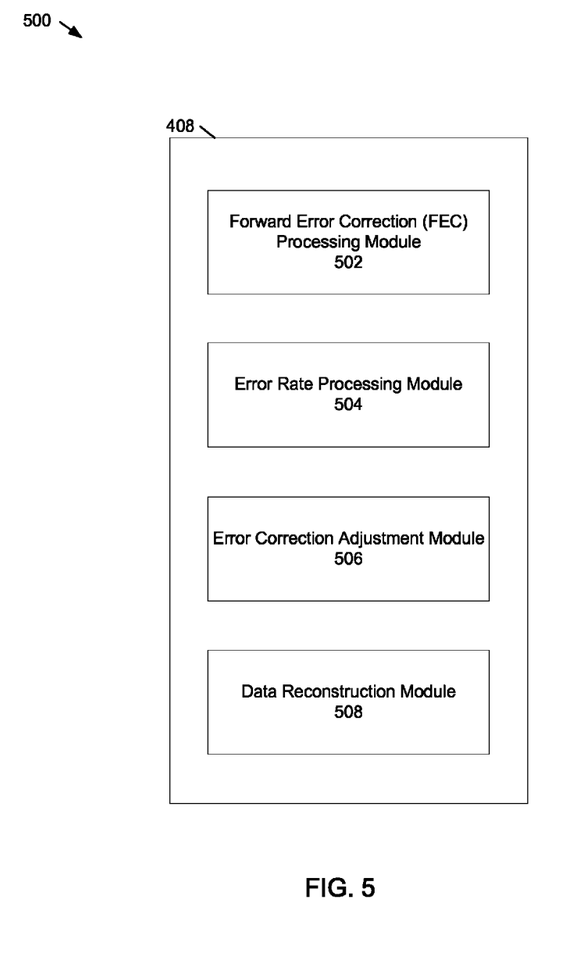
FIG. 5 shows example components of the error correction module of FIG. 4.

FIG. 5 shows example components 500 of the error correction module 408. The example error correction module 408 includes an FEC processing module 502, an error rate processing module 504, an error correction adjustment module 506, and a data reconstruction module 508.

The example FEC processing module 502 generates a version of the data with FEC applied when packet data is transmitted from physiological sensor 110. With some types of FEC, for every data packet generated at physiological sensor 110, the FEC processing module 502 generates an FEC code that includes redundancy for the packet. For other types of FEC, for every group of packets generated at physiological sensor 110, the FEC processing module 502 generates an FEC code that includes redundancy for the group of packets. This type is typical when FEC is spread in time.

In examples, an FEC code produced by a compressive sampling technique may be implemented. The FEC code produced by compressive sampling provides data redundancy without making exact copies of the packet data. However, enough redundancy is generated so that the packet data can be reconstructed when transmission errors or packet loss occurs.

Using compressive sampling and an appropriate basis, e.g. a Gabor basis for ECG waveforms, waveform data may be reconstructed, even in times when a complete packet is lost. This is in contrast to encoding such as Reed-Solomon where individual bit errors can be recovered, but not an entire packet's data content. Waveform reconstruction may have some noise, but is clinically insignificant up to packet loss rates of 30 percent.

In other embodiments other techniques for providing FEC coding may be used. Examples include Reed-Solomon coding and low-density parity-check (LDPC) coding. Further examples include redundant transmission and also data compression and redundant transmission. In this case, a packet consisting of data packets n and n+1 may be transmitted, followed by a packet consisting of data packets n+1 and n+2, and this followed by a packet consisting of waveform packets n+2 and n+3. Other variations including: not placing data packets n and n+1 in the same packet, enabling/disabling the redundant data, and higher levels of redundancy, for example, transmitting packets n, n+1, and n+2, are possible.

If any packet is lost, then next transmission automatically repeats the data. Such a solution may be useful for streaming data where User Datagram Protocol (UDP) is used, yet high reliability is required. Data compression along with redundant transmission may allow for no net increase in data transmitted. The aggregation of waveform packets into radio packets may vary from the example provided above.

With FEC that uses compressive sampling for encoding, computation required for reconstruction of data increases rapidly with increasing packet loss rates. As such, reconstruction of compressive sampling FEC encoded packets may only occur when packet loss, as reflected in a packet transmission error rate, is less than a pre-determined level. In addition, the pre-determined level is dependent upon packet size.

In a simplified example, if a data element of 1000 bytes is transmitted as a group of ten packets, each having a packet size of 100 bytes, and three of the ten packets are lost, it may be possible to reconstruct the 1000-byte packet element from the seven packets that are received. However, the computational burden of this reconstruction may be unacceptable, and the pre-determined level may be two of ten packets. In another example, if the data element is transmitted as two 500-byte packets and one 500-byte packet is lost, the packet cannot be reconstructed, regardless of the computation resources available.

The example error rate processing module 504 determines a transmission error rate, including a packet loss rate, and adjusts packet error correction accordingly. The transmission error rate reflects any errors that occur during data transmissions from physiological sensor 110. However, because patient monitor 112 transmits directly to intermediate node 114, the transmission error rate reflects the data transmission from patient monitor 112 to intermediate node 114.

Additional transmission errors may occur in data transmissions from intermediate node 114 through intermediate nodes 116 and 118 to endpoint 2 (EMR system 120). The packet loss rate reflects a rate of packets lost in data transmissions between endpoint 1 (for example physiological sensor 110) and endpoint 2. Typically, for streaming data, data packets are transmitted from endpoint 1 without acknowledgment that the data packets have been received by endpoint 2. This is because the overhead for end-to-end acknowledgement can be very high and for streaming data, new data is more important to transmit than the old data.

For example, if packets contain sequence numbers, endpoint 2 can determine if any packet is missing and then transmit a status message to intermediate node 112 and/or endpoint 1 to inform patient monitor 112 and/or endpoint 1 of any packet loss. Optionally, this message would only occur if there is packet loss, or alternately, if there is a significant change in the packet loss rate. From this status information, the error rate processing module 504 determines an end-to-end packet loss rate.

Since Internet Control Message Protocol (ICMP) ping messages are responded to, a way to approximate packet loss rate is for endpoint 1 (physiological sensor 110) to transmit an ICMP Ping to endpoint 2 and infer the physiological data loss rate from the ping packet loss rate though this approximation may add overhead.

The example error correction adjustment module 506 uses the transmission error rate to determine whether to adjust packet transmission size and whether to disable or error correction. For example, when the transmission error rate is at a level where there are an insufficient number of packets successfully transmitted to permit reconstruction of the physiological data, the error correction adjustment module 506 may decrease the packet size of each data transmission.

Decreasing the packet size of each data transmission results in the transmission of more packets for the same data element of physiological data. Transmitting smaller packets, as discussed earlier, decreases the probability of transmission failure, making it more likely that the physiological data can be received and reconstructed (if required) in a given communication channel.

When it is determined that the transmission error rate is low enough so that data can be reconstructed, the error correction adjustment module 506 may increase the packet size of each data transmission. Increasing the packet size of each data transmission results in less packets being needed to transmit the data element of physiological data. Transmitting fewer packets at a tolerable error rate may increase the throughput of the overall data transmission.

Further, when it is determined that the transmission error rate is zero or near zero, the error correction adjustment module 506 may disable FEC. Disabling FEC when FEC is not required further improves the throughput of the overall data transmission. In addition, disabling FEC may improve power efficiency at patient monitor 112. If patient monitor 112 is a portable device disabling FEC may increase battery life for patient monitor 112. After disabling FEC, if it is determined that packet loss is occurring, the error correction adjustment module 506 may enable FEC.

The error correction adjustment module 506 may automatically enable or disable reconstruction based on a transmission error rate or based on a CPU load at the EMR system 120. The error correction adjustment module 506 may instruct the data reconstruction module 508 to simply not attempt to reconstruct the packets when the transmission error rate exceeds a pre-determined threshold.

When making a determination as to whether to increase or decrease packet size or to disable or enable FEC, the error correction adjustment module 506 determines whether the transmission error rate is above or below one or more predetermined thresholds. For example, there may be a first predetermined threshold for determining whether to increase packet size, a second predetermined threshold for determining whether to decrease packet size, a third predetermined threshold for determining whether to disable FEC and a fourth predetermined threshold for determining whether to enable FEC. The predetermined threshold may be configured into memory on physiological sensor 110, patient monitor 112 and on one or more of the intermediate nodes 114, 116, 118 and on EMR system 120. The values of the predetermined thresholds are typically determined from error data from past data transmissions.

Packet size may also be adjusted as part of the Internet Protocol (IP). For example, some access nodes specify maximum transmission units (MTU). If a packet is to be transmitted by an access node, for example at intermediate node 114, for which the packet size is greater than the MTU, any packet received at the access node is automatically fragmented into a packet size equal to the MTU by the IP layer. Packet size may also be adjusted as part of the 802.11 protocol. For example, some access nodes specify a fragmentation threshold, above which packets are fragmented by the 802.11 MAC layer. If a packet is to be transmitted by an access node, for example at intermediate node 114, for which the packet size is greater than the fragmentation threshold, any packet received at the access node is automatically fragmented into a packet size equal to the fragmentation threshold.

Figure 6:
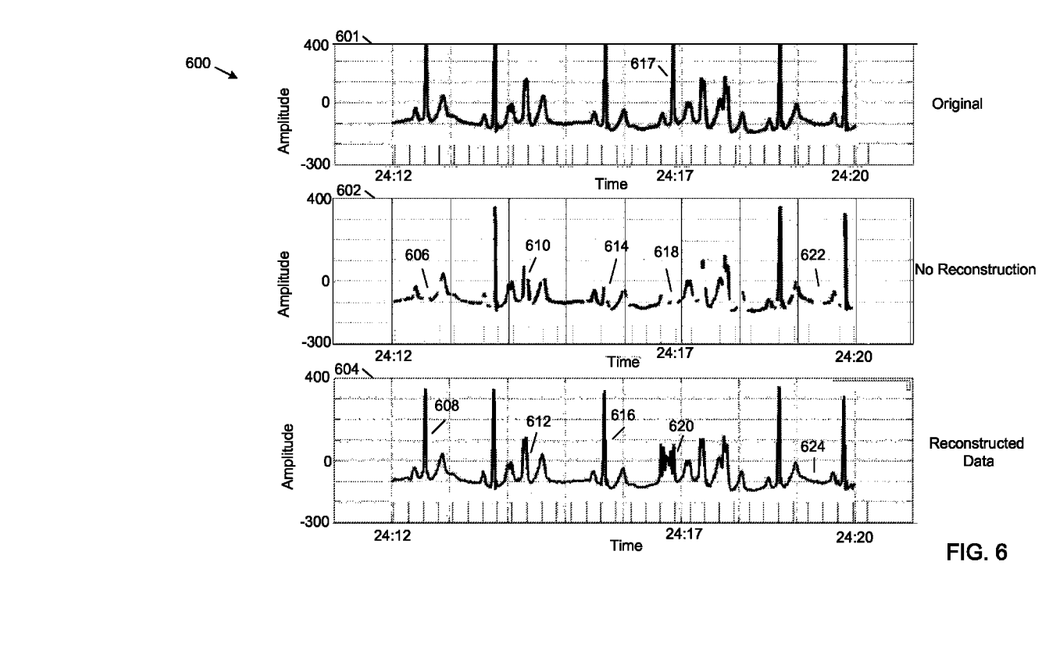
FIG. 6 shows an example illustration of physiological data waveform reconstruction.

In some embodiments, when the transmission error rate is high, the error correction adjustment module 506 may impose limits as to a type of data being transmitted and/or the data reconstruction module 508 on the receiver may impose limits on the reconstruction. For example, when a packet error rate exceeds 30%, there is a high probability of errors in reconstruction, so packets may be reconstructed for packet error rates significantly less than 30%, e.g., 10%. Errors in reconstruction are shown in FIG. 6 where the packet loss rate is 35%. In FIG. 6 at time 24:17, in the original data, there is a small peak followed by a large peak 617. In the reconstructed data, there are two moderate height peaks 620 with noise.

The data reconstruction module 508 determines whether a sufficient number of packets have been received at EMR system 120 to permit reconstruction of the physiological data. When the number of packets lost during the physiological data transmission is below a predetermined threshold, yet greater than zero, the data reconstruction module 508 uses the redundant packet data in the FEC 1 code to attempt to reconstruct lost packets of physiological data. The FEC 1 code as illustrated in FIG. 3 represents redundant packet data as transmitted from physiological sensor 110. As discussed, because the FEC 1 code is generated in the application layer at physiological sensor 110 and transmitted in the data portions of messages 326, 302, 308, 314 and 320, the FEC 1 encoded data are available at EMR system 120.

FIG. 6 shows example drawings 600 of how lost packets of physiological data may be reconstructed. The top portion of FIG. 6 shows an example waveform 601. A middle portion of FIG. 6 shows an example waveform 602 representing physiological data, including lost packets, as received at an endpoint, for example at the EMR system 120. A bottom portion of FIG. 6 shows an example waveform 604 representing reconstructed physiological data. In this example, the packet loss rate is 35 percent where there is sufficient FEC to recover the data in some areas and where there is insufficient FEC to recover the data in some other areas. The waveform 604 is created by using redundant packet data from a FEC code, for example from the FEC1 code.

The waveform 602 includes missing sections 606, 610, 614, 618 and 622. The example missing sections 606, 610, 614, 618 and 622 are missing because of packet loss during the data transmission from physiological sensor 110 to EMR system 120. The waveform 604 shows how redundant data from the FEC 1 code is used to replace the missing portions from waveform 602. For example, missing section 606 is replaced with section 608, missing section 610 is replaced with section 612, missing section 614 is replaced with section 616, missing section 618 is replaced with section 620 and missing section 622 is replaced with section 624. For this high packet loss rate at section 620, insufficient FEC exists to correctly reconstruct the data. This illustrates the need to limit reconstruction at high packet loss rates, such as 35 percent.

Figure 7:
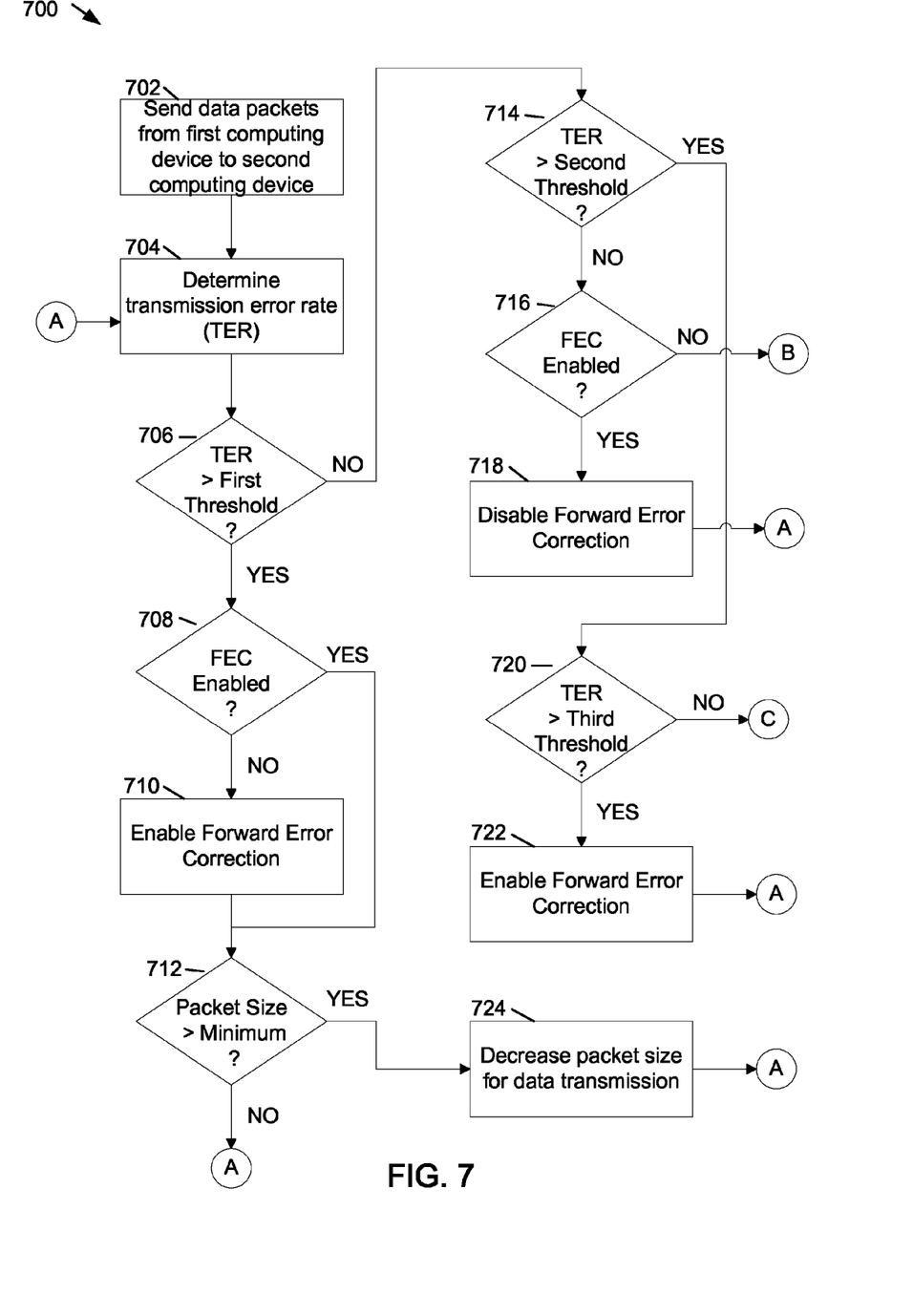
FIGS. 7 and 8 show a flowchart for a method of improving wireless transmission reliability from the body area network of FIG. 1.
Figure 8:
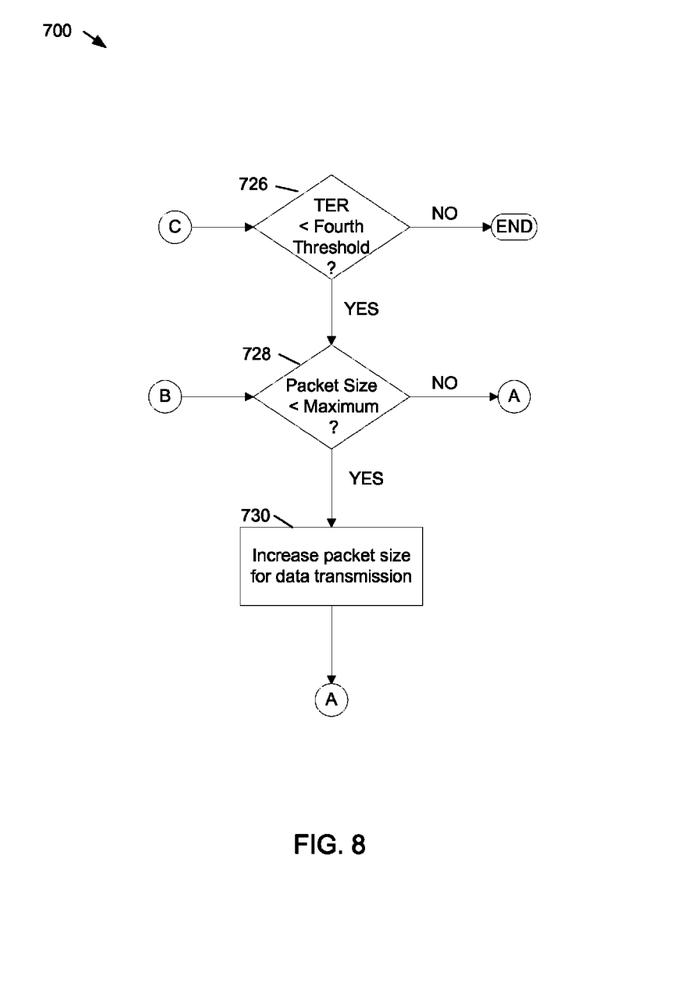

FIGS. 7 and 8 show a flowchart 700 for a method for improving wireless transmission reliability. At operation 702, data packets containing physiological data are transmitted from a physiological sensor, for example from physiological sensor 110 to an EMR system, for example EMR system 120. Physiological sensor 110 and EMR system 120 are both electronic computing devices. The data packets are sent over one or more wireless networks that typically implement the IEEE 802.11 protocol.

At operation 704, a transmission error rate is determined for transmission of the physiological data. The transmission error rate may be determined over a period of time, such as a 5-minute interval. The transmission error rate may include actual errors that occur during the transmission. Examples of actual errors are timeouts, errors relating to non-delivery of one or more packets between endpoints. The transmission error rate may also include a packet loss rate. The packet loss rate is an indication of a number of packets that are lost during the transmission from the patient monitor 112 and that do not arrive at EMR system 120.

The packet loss rate may also include a loss rate between the first endpoint and any intermediate node, for example, patient monitor 112. Typically, an endpoint for the transmission, in this example EMR system 120, sends a status message to patient monitor 112 providing an indication of packets lost during the transmission. Between endpoint 1 (physiological sensor 110) and patient monitor 112, endpoint 1 can determine the packet loss rate based on the number of Acknowledgements received from patient monitor 112.

At operation 706, a determination is made as to whether the transmission error rate is greater than a first predetermined threshold. When the transmission error rate is greater than the first predetermined threshold, at operation 708, a determination is made as to whether forward error correction is enabled. When it is determined that forward error correction is not enabled, at operation 710, forward error correction is enabled. Control then proceeds to operation 712.

At operation 712, a determination is made as to whether the packet size is greater than a minimum value. The minimum value is a preconfigured value that represents a minimum packet size for transmission. An example of a preconfigured minimum packet size is 250 bytes.

When it is determined that the packet size is greater than the minimum value, at operation 724 a size of each of the packets being transmitted is decreased. Control then passes to operation 704 and a determination of the transmission error rate is made again.

Decreasing the packet size increases the probability that physiological data can be reconstructed at EMR system 120. Decreasing the packet size also increases the probability that the packet will be received without a bit error. As more packets are transmitted because of the decreased packet size, there is a higher probability that enough packets (each including redundant data) are received at EMR system 120 to permit reconstruction of any lost physiological data.

When the transmission error rate is not greater than the first predetermined threshold, at operation 714, a determination is made as to whether the transmission error rate is not greater than a second predetermined threshold. The second predetermined threshold corresponds to a very low transmission error rate, typically very close to zero.

When it is determined that the transmission error rate is not greater than the second predetermined threshold, at operation 716 a determination is made as to whether forward error correction is enabled. When it is determined that forward error correction is enabled, at operation 718 FEC is disabled. Control then passes to operation 704 and a determination of the transmission error rate is made again. When it is determined at operation 716 that forward error correction is not enabled, control passes to operation 728, as discussed later herein.

When it is determined at operation 714 that the transmission error rate is greater than the second predetermined threshold, at operation 720, a determination is made as to whether the transmission error rate is greater than a third predetermined threshold. The third predetermined threshold is greater than the second predetermined threshold but less than the first predetermined threshold. The third predetermined threshold is high enough so that error correction is necessary. When a determination is made that the packet error rate is greater than the third predetermined threshold, at operation 722, forward error correction is enabled. Control then passes to operation 704 and a determination of the transmission error rate is made again.

When a determination is made at operation 720 that the transmission error rate is not greater than the third predetermined threshold, at operation 726, a determination is made as to whether the transmission error rate is less than a fourth predetermined threshold. The fourth predetermined threshold is greater than the third predetermined threshold but less than the first predetermined threshold.

When it is determined that the transmission error rate is less than the fourth predetermined threshold, control passes to operation 728. At operation 728, a determination is made as to whether the packet size is less than a maximum value. The maximum value is a preconfigured value that represents a maximum packet size for transmission. An example of a preconfigured maximum packet size is 1500 bytes.

When it is determined that the packet size is less than the maximum value, at operation 730, a size of each of the packets being transmitted is increased. Control then passes to operation 704 and a determination of the transmission error rate is made again.

Having a transmission error rate greater than a minimal value, but low enough that data reconstruction can be performed on lost packets, indicates that the packet size can be increased. Increasing packet size improves transmission efficiency.

A physiological sensor, patient monitor and EMR system are computing devices and typically include at least one processing unit, system memory and a power source. Depending on the exact configuration and type of computing device, the system memory may be physical memory, such as volatile memory (such as RAM), non-volatile memory (such as ROM, flash memory, etc.) or some combination of the two. System memory typically includes an embedded operating system suitable for controlling the operation of the sensor device. The system memory may also include one or more software applications and may include program data.

The various embodiments described above are provided by way of illustration only and should not be construed to limiting. Various modifications and changes that may be made to the embodiments described above without departing from the true spirit and scope of the disclosure.

What is claimed is:

1. A method for performing error correction during a transmission of physiological data, the method comprising:
    sending two or more data packets from a first electronic computing device to a second electronic computing device, each of the data packets including physiological data, each of the data packets having a first packet size, and each of the data packets including error correction information, the error correction information being included within each of the two or more data packets;
    determining a transmission error rate for the two or more data packets; and
    based on the transmission error rate, adjusting a packet size for data transmission to a second packet size;
    wherein adjusting a packet size for data transmission further comprises decreasing the first packet size when the transmission error rate is greater than a first predetermined threshold; and wherein determining the transmission error rate further comprises disabling error correction at the first electronic computing device when the transmission error rate is not greater than a second predetermined threshold, the second predetermined threshold being smaller than the first predetermined threshold.

2. The method of claim 1, wherein determining the transmission error rate comprises determining a packet error rate for the data transmission.

3. The method of claim 1, wherein determining the transmission error rate comprises determining a packet loss rate for the data transmission.

4. The method of claim 1, wherein determining the transmission error rate further comprises enabling error correction at the first electronic computing device when the transmission error rate is greater than a third predetermined threshold, the third predetermined threshold being smaller than the first predetermined threshold but larger than the second predetermined threshold.

5. The method of claim 4, wherein adjusting a packet size for data transmission further comprises increasing the first packet size when the transmission error rate is less than a fourth predetermined threshold, the fourth predetermined threshold being smaller than the first predetermined threshold but larger than the third predetermined threshold.

6. The method of claim 1, wherein error correction is enabled or disabled automatically based on the transmission error rate.

7. The method of claim 1, further comprising sending one or more additional data packets from the first electronic computing device to the second electronic computing device, each of the one or more additional data packets having the second packet size.

8. The method of claim 1, wherein error correction is enabled or disabled automatically based on a CPU load at the first electronic computing device or at the second electronic computing device.

9. The method of claim 1, wherein the first electronic computing device and the second electronic computing device are not directly connected and wherein the error correction information is maintained from the first electronic computing device to the second electronic computing device.

10. The method of claim 1, wherein error correction is implemented above a data link layer.

11. The method of claim 1, further comprising receiving a management level communication from the second electronic computing device, wherein the management level communication includes information on one or more of battery power, signal strength, packet size and whether to disable or enable data error correction.

12. A first electronic computing device, comprising:
a processing unit;
a system memory connected to the processing unit, the system memory comprising instructions that, when executed by the processing unit, cause the processing unit to:
send two or more data packets from the first electronic computing device to a second electronic computing device, each of the data packets including physiological data, each of the data packets having a first packet size, each of the data packets including error correction information, the error correction information for each of the two or more data packets being distributed across the two or more data packets, the error correction information incorporating a method of forward error correction, the error correction information providing redundant packet data in a data portion of each of the data packets;
determine a transmission error rate for the one or more data packets, the transmission error rate being determined from packet error information received from the second electronic computing device;
determine whether the transmission error rate is greater than a first predetermined threshold;
when the transmission error rate is greater than the first predetermined threshold, decrease the first packet size to a second packet size;
determine whether the transmission error rate is not greater than a second predetermined threshold, the second predetermined threshold being smaller than the first predetermined threshold;
when the transmission error rate is not greater than the second predetermined threshold, disable forward error correction at the first electronic computing device;
determine whether the transmission error rate is greater than a third predetermined threshold, the third predetermined threshold being smaller than the first predetermined threshold but larger than the second predetermined threshold;
when the transmission error rate is greater than the third predetermined threshold, enable error correction at the first electronic computing device;
determine whether the transmission error rate is less than a fourth predetermined threshold, the fourth predetermined threshold being smaller than the first predetermined threshold but larger than the third predetermined threshold;
when the transmission error rate is less than the fourth predetermined threshold, increase the first packet size to a third packet size;
send one or more additional data packets from the first electronic computing device to the second electronic computing device, each of the one or more additional data packets having either the first packet size, the second packet size or the third packet size;
receive information that data reconstruction errors at the second electronic computing device are greater than the fourth predetermined threshold;
when it is determined that the data reconstruction errors at the second electronic computing device are greater than the fourth predetermined threshold, impose a limit on a type of data to be transmitted at the first electronic computing device; and
send management level communication in the one or more data packets, the management level communication including information on one or more of battery power, signal strength, packet size and whether to disable or enable data error correction.

* * * * *